United States Patent
Hendrickson et al.

(10) Patent No.: US 6,897,008 B1
(45) Date of Patent: May 24, 2005

(54) TERPENE ETHER DEVELOPING SOLVENT FOR PHOTOPOLYMERIZABLE PRINTING PLATES

(75) Inventors: Constance Marie Hendrickson, Irving, TX (US); David Calvin Bradford, Winston Salem, NC (US)

(73) Assignee: NuPro Technologies, Inc., Winston Salem, NC (US)

( * ) Notice: Subject to any disclaimer, the term of this patent is extended or adjusted under 35 U.S.C. 154(b) by 0 days.

(21) Appl. No.: 10/701,662

(22) Filed: Nov. 6, 2003

(51) Int. Cl.⁷ ................................................. G03F 7/30
(52) U.S. Cl. ...................................................... 430/306
(58) Field of Search .......................................... 430/306

(56) References Cited

U.S. PATENT DOCUMENTS

| | | | |
|---|---|---|---|
| 4,590,302 A | 5/1986 | Scheidl et al. | 568/665 |
| 4,698,180 A | 10/1987 | Pavlin | 252/522 |
| 6,248,502 B1 | 6/2001 | Eklund | 430/300 |
| 6,395,689 B1 | 5/2002 | Wagner et al. | 508/580 |
| 6,582,886 B1 | 6/2003 | Hendrickson | 430/294 |

OTHER PUBLICATIONS

Product Data Sheet for AlphaSolv™ TME. May 25, 2001.
Material Safety Data Sheet for AlphaSolv™ TME. May 24, 2001.
T2 Labs Product Listing. Aug. 11, 2004.

*Primary Examiner*—Hoa Van Le
(74) *Attorney, Agent, or Firm*—Blank Rome LLP

(57) ABSTRACT

Flexographic printing plates are produced by exposing the photopolymer plates to a light source and washing out (developing) the masked out, non-exposed areas with a solvent. The invention provides terpene ether solvents suitable for use in the development of photopolymer printing plates. The solvents, which include terpene ethers alone or mixed with co-solvents and/or non-solvents, are effective in developing a large number of different photopolymer printing plates and can produce images superior to those obtained with commercially available solvents currently used in such applications.

15 Claims, No Drawings

TERPENE ETHER DEVELOPING SOLVENT FOR PHOTOPOLYMERIZABLE PRINTING PLATES

FIELD OF THE INVENTION

The present invention relates to an improved solvent and process for the production of flexographic printing plates crosslinked by photopolymerization. More specifically, the invention relates to a solvent system using terpene ethers, alone or in combination with co-solvents and/or non-solvents, as washout solvents for the unpolymerized material in the printing plates to develop a relief image and a method for developing printing plates.

BACKGROUND OF THE INVENTION

Washout processes for the development of photopolymerizable flexographic printing plates are well known and is described in detail in U.S. Pat. No. 5,240,815 which is incorporated herein by reference. Ordinarily, exposed plates are washed (developed) in a developing solvent that can remove the unpolymerized material while leaving the polymerized (cured) material intact. The solvent typically used in such processes include: (a) chlorohydrocarbons, such as trichloroethylene, perchloroethylene or trichloroethane, alone or in a mixture with a lower alcohol, such as n-butanol; (b) saturated cyclic or acyclic hydrocarbons, such as petroleum ether, hexane, heptane, octane, cyclohexane or methylcyclohexane; (c) aromatic hydrocarbons, such as benzene, toluene or xylene; (d) lower aliphatic ketones, such as acetone, methyl ethyl ketone or methyl isobutyl ketone; and (e) terpene hydrocarbons, such as d-limonene.

One important disadvantage of the known solvents and the procedures for their use is that the solvents being used as developers may act too slowly, cause swelling of the plates and/or cause damage to the fine detail in the plate by undercutting and/or pinholing. Moreover, when non-chlorinated solvents are used in the washout process, long drying times may be necessary. Furthermore, many of these solvents have flashpoints of less than 100° F., so that the process can only be operated in special, explosion-protected plants. Many of the prior art solvents are considered Hazardous Air Pollutants (HAPS), and are subject to stringent reporting requirements. When chlorohydrocarbons and other toxic chemicals are used, their toxicity also gives rise to disposal problems and worker safety issues.

An essential step to any photopolymerizable relief printing process is the development of the printing plate after the image is formed through imagewise exposure of the photopolymerizable plate to light. The image is formed by polymerizing and crosslinking of the photopolimerizable material that is exposed while the unexposed portion remains unpolymerized. Ordinarily, development is accomplished by washing the exposed plate in a solvent which can remove the unpolymerized material while leaving the polymerized (cured) material intact. Since such plates can be formed from a variety of materials, it is necessary to match a specific plate with an appropriate solvent. For example, U.S. Pat. No. 4,323,636, U.S. Pat. No. 4,323,637, U.S. Pat. No. 4,423,135, and U.S. Pat. No. 4,369,246, the disclosures of which are incorporated herein by reference, disclose a variety of photopolymer printing plate compositions based on block copolymers of styrene and butadiene (SBS) or isoprene (SIS). These compositions can be utilized to produce printing plates which can be developed by a number of aliphatic and aromatic solvents, including methyl ethyl ketone, toluene, xylene, d-limonene, carbon tetrachloride, trichloroethane, methyl chloroform, and tetrachloroethylene. These solvents may be used alone or in a mixture with a "non-solvent" (i.e. a substance that cannot dissolve unpolymerized materials), for example, trichloroethane with ethanol. In any case, during the development step, the solvent can be applied in any convenient manner such as by pouring, immersing, spraying, or roller application. Brushing, which aids in the removal of the unpolymerized or uncrosslinked portions of the composition, can also be performed to facilitate the processing of the plate.

Similarly, UK 1,358,062 discloses photosensitive compositions consisting of a nitrile rubber with an addition of photopolymerizable tri- or tetra-unsaturated ester derived from acrylic or methacrylic acid combined with an addition polymerization initiator activated by actinic radiation. Plates made from this composition can be developed by organic solvents including aliphatic esters such as ethyl acetate, aliphatic ketones such as acetone, methyl ethyl ketone, d-limonene, halogenated organic solvents, such as chloroform, methylene chloride, CFC 113 or blends of such solvents. Brushing or agitation can be used to facilitate the removal of the non-polymerized portion of the composition.

U.S. Pat. No. 4,177,074 discloses a photosensitive composition containing a high molecular weight butadiene/acrylonitrile copolymer which contains carboxyl groups, a low molecular weight butadiene polymer which may or may not contain carboxyl groups, and an ethylenically unsaturated monomer, combined with a free-radical generating system. This composition is also used as the polymer layer of a flexographic printing plate and requires processing with such organic solvents as methyl ethyl ketone, benzene, toluene, xylene, d-limonene, trichloroethane, trichlorethylene, methyl chloroform, tetrachloroethylene, or solvent/non-solvent mixtures, e.g., tetrachloroethylene and n-butanol. The composition may also be processed with water-soluble organic solvents in an aqueous basic solution, such as sodium hydroxide/isopropyl alcohol/water; sodium carbonate/isopropyl alcohol/water; sodium carbonate/2-butoxyethanol/water; sodium borate/2-butoxyethanol/water; sodium silicate/2-butoxyethanol/water; sodium borate/2-butoxyethanol/water; sodium silicate/2-butoxyethanol/water; and sodium carbonate/2-(2-butoxyethoxy)ethanol/water.

U.S. Pat. No. 4,517,279, the disclosure of which is incorporated herein by reference, discloses a photosensitive composition containing a high molecular weight butadiene acrylonitrile copolymer which contains carboxyl groups, and a high molecular weight butadiene/acrylonitrile copolymer which does not contain carboxyl groups, combined with ethylenically unsaturated monomer and a free radical generating system. That composition, which is also used as the polymer layer of a flexographic printing plate, requires processing by blends of tetrachloroethylene and a non-solvent. The composition may also be processed in mixtures of sodium hydroxide/isopropyl alcohol/water; sodium carbonate/2-butoxyethanol/water; sodium silicate/2-butoxyethanol/water, sodium carbonate/2-butoxyethanol/glycerol/water; and sodium hydroxide/2-(2-butoxyethoxy) ethanol/water.

As can be seen from the foregoing examples of the prior art, the solvents needed for image development will vary depending on the composition of the polymer layer of the plate. The need for different solvent systems is particularly inconvenient, especially if different photopolymer systems are being processed at the same facility. Furthermore, many of the solvents used to develop the plates are toxic or suspected carcinogens. Thus, there exists a real need for solvent systems which can be used with a greater degree of safety. In addition, there exists a need for solvent systems which can be used in a variety of plates. U.S. Pat. No. 4,806,452 and U.S. Pat. No. 4,847,182, the disclosures of which are incorporated herein by reference, disclose solvent developers for flexographic plates containing terpene hydrocarbons such as d-limonene which are effective on a variety of plate types. These terpene hydrocarbon-based developers are also non-toxic. However, they have proven to be hazards in the workplace because of their tendency to spontaneously combust thereby causing fires. The terpene hydrocarbons also have low flash points compared to the terpene ethers, e.g., the flash point of d-limonene (tag closed cup method (TCC)) is 120 degree F., whereas the flash point of terpinyl alkyl ether (TCC) is >200 degree F. which increases the safety of the terpene ethers.

Therefore, commonly assigned U.S. Pat. No. 6,248,502 and U.S. Pat. No. 6,582,886 solve the drawbacks of terpene by using terpene esters and methyl esters as substitute developing solvents. Because terpene ester has a higher flash point, the fire risk is greatly decreased. However, terpene esters tends to breakdown through repeated distillation which limits the recyclability of the solvent.

The present invention relates to an environmentally friendly developing solvent, that offers improvement over the prior art, comprising terpene ether.

SUMMARY OF THE INVENTION

The present invention comprises solvents for use in the processing of a wide variety of photopolymeric materials used to form photopolymer printing plates. These solvents, which comprise terpene ethers either alone or in the presence of other organic materials (co-solvents and non-solvents), can be used with a variety of polymeric systems, including, but is not limited to SBS and SIS polymer systems, as well as a large number of nitrile rubber and other copolymer systems. The terpene ethers are natural products with low toxicity and are relatively safe to use compared with other solvent systems. Terpene ethers, it has been discovered, provide a unique combination of reduced cost, improved plate quality, low volatility, improved regulatory compliance, low toxicity, reduced washout time, and biodegradability.

It is, therefore, an object of the present invention to provide a solvent system and a process for the preparation of relief plates crosslinked by photopolymerization, in which the washout time and the drying time are substantially shorter compared with the conventional process solvents, and wherein the relief plates suffer neither excessive surface swelling nor under-washing and are characterized by improved relief depths and sidewall structure.

Another object of the present invention is to provide a process for the preparation of relief plates crosslinked by photopolymerization which is capable of operation without expensive explosion protection.

It is another object of the present invention to provide solvent systems for use with photopolymeric printing plates which overcome the spontaneous combustion problems of the prior art solvent systems.

It is another object of the present invention is to provide solvent systems which minimizes workplace hazards and requires minimal regulatory reporting.

DETAILED DESCRIPTION OF THE INVENTION

The present invention comprises terpene ether solvents for use in photopolymer printing plate processing. The terpene ethers, which can be used either alone or in a blended form with co-solvents or non-solvents, can be used to develop a number of different photopolymer printing plates. As used herein, co-solvents are non-terpene ether compounds that can also dissolve the non-polymerized material; and non-solvents are compounds that cannot dissolve the non-polymerized material. A wide variety of terpene esters are suitable for use in the solvents of this invention including, but not limited to, terpenyl alkyl ether, fenchyl alkyl ether, limonyl alkyl ether, and geranyl alkyl ether, with one alkyl group from 1–18 carbons.

Mixtures of terpene ethers can also be used and may show synergistic effects when compared with a terpene ether used alone. When a combination of two or more terpene ethers is used, the resulting blend is often more effective as a solvent than the individual terpene ethers. This blend is referred to herein as a MTE (Mixed Terpene Ether) solvent.

The mixture of terpene ethers can be varied but a suitable mixture is about 35–65% by weight terpinyl ether is mixed with about 15–45% by weight fenchyl ether and about 10–35% by weight linalyl ether. A preferred mixture is about 40–60% by weight terpinyl ether is mixed with about 20–40% by weight fenchyl ether and about 15–30% by weight linalyl ether and an ever more preferred mixture is about 45–55% by weight terpinyl ether is mixed with about 25–35% by weight fenchyl ether and about 15–25% by weight linalyl ether. The preferred carboxylic acids used to form the ethers of the terpene alcohols are formic, acetic, propionic and butyric acids and with the preferred carboxylic acid being acetic acid.

Various co-solvents (non-terpene ether compounds that can also, by themselves, dissolve the non-polymerized material) and non-solvents (compounds that cannot, by themselves, dissolve the non-polymerized material) can also be employed with the terpene ethers and MTE according to the invention. Suitable co-solvents include, but is not limited to, terpene ester, alkyl ester, n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

The co-solvent should be soluble in the terpene ether or MTE, should have suitable dissolving properties towards the non-photolysed (non-polymerized) portions of the plate that are to be dissolved, should have low toxicity and acceptable safety profiles, and should be readily disposable. The co-solvents are used to modify the properties of the solvent blend. This includes, for example, the addition of co-solvents to aid in the removal of the top protective cover skin on the flexographic plate. In addition, several of the co-solvents, such as terpene alcohols, in particular alpha terpineol, serve as stabilizers to prevent the separation of the solvent blend, which can occur at reduced temperatures. This stabilizer property of the co-solvent becomes important when isoparaffinic hydrocarbons are used as the non-solvent and benzyl alcohol is used as a co-solvent to remove the outer layer of the photopolymerizable printing plate since the benzyl alcohol may separate from the terpene ethers and paraffinic hydrocarbon mixture. Further, the mixture of terpene ethers and co-solvent may be more effective as a solvent than the individual terpene ethers by itself.

The non-solvent should be miscible with the terpene ether or terpene ethers and the co-solvents, should have acceptable toxicity and safety profiles, and should be readily disposable or recyclable. The non-solvent are typically used as a filler to reduce cost, therefore, recyclability of the non-solvent material is highly desirable. Suitable non-solvents include, but is not limited to, petroleum distillates, such as aliphatic petroleum distillates, naphthas, paraffinic solvents, hydrotreated petroleum distillates, mineral oil, mineral spirits, ligroin, decane, octane, hexane and other similar materials. Isoparaffinic solvents are commercially available in a wide range of volatility and corresponding flash points. The developing solvent of the invention can made with a wide range of commercially available isoparaffinic solvents as its non-solvent base. The following table shows volatilities and properties of commercially available isoparaffinic solvents suitable for use with the invention.

TABLE 1

| | Volatility | | | | |
|---|---|---|---|---|---|
| Flash Point (° F.) | 106 | 129 | 135 | 147 | 196 |
| Initial Boiling Point (° F.) | 320 | 352 | 350 | 376 | 433 |
| 50% Dry Point (° F.) | 331 | 360 | 365 | 383 | 460 |
| | 345 | 370 | 386 | 405 | 487 |
| Vapor Pressure (mm Hg @ 100° F.) | 14 | 6.2 | 5.7 | 5.2 | 3.1 |

Parameters such as drying rates, fire risk, workplace air quality and volatile organic compound emissions will also play a role in the selected non-solvent choice.

In addition, in a commercially acceptable product, odor masking materials or perfumes are often added. Such odor masking materials or perfumes can include terpenes to impart a clean, fresh odor.

The developing solvent components can be varied but a suitable composition would be about 7.5–20% by volume of at least one terpenyl ether and preferably a mixture of terpenyl ethers, about 7.5–20% by volume of a first co-solvent capable of dissolving the top protective cover layer of the flexographic plate, about 0.5–7.5% by volume of a second co-solvent capable of acting as a stabilizer and preventing the solvents from separating and the remainder non-solvent and optionally less than about 2% by volume of a perfume or odor masking material. A preferred composition would be about 10–15% by volume of at least one terpenyl ether and preferably a mixture of terpenyl ethers, about 10–15% by volume of a first co-solvent capable of dissolving the top protective cover layer of the flexographic plate, about 0.5–5.0% by volume of a second co-solvent capable of acting as a stabilizer and preventing the solvents from separating and the remainder non-solvent. In a particularly preferred composition the first co-solvent is benzyl alcohol, the second suitable co-solvent is alpha terpineol and the non-solvent is an isoparaffinic hydrocarbon.

The terpene ether-based solvents may be substituted for the synthetic hydrocarbon, oxygenated solvents or halogenated hydrocarbon solvents used for processing photopolymer printing plates. For example, the terpene ether solvents are suitable in the processing of photopolymer printing plates based on block copolymers of styrene and butadiene (SBS) or styrene and isoprene (SIS), copolymers of butadiene and acrylonitrile, terpolymers of butadiene, acrylonitrile and acrylic acid and other similar photopolymers. The terpene ether-based solvents can be applied to the plates by any conventional application means including spraying, brushing, rolling, dipping (immersing) or any combination thereof. The terpene ether solvents also produce photopolymer plates with less cured polymer image swelling than those processed in conventional hydrocarbon or chlorinated hydrocarbon solvents. Since swelling tends to distort the image formed, this surprising result permits clear, sharp images to be formed at much lower exposure times than those resulting from the use of conventional solvents. Additionally, the solvents of the invention have fairly low volatility which reduces worker exposure during plate processing. Furthermore, because terpene ethers are natural products, they are much less toxic and are more readily biodegradable than synthetic hydrocarbon or chlorinated hydrocarbon solvents.

It was also surprising to discover that when isoparaffinic hydrocarbons having flash points above 120° F. such as Exxon's ISOPAR L are used instead of high flash point hydrotreated naphthinics such as hydrotreated Shell 142 solvent, the drying time of the photopolymerizable plate was reduced by more than 50%. This reduction in drying time is very significant because high volume flexographic platemakers are usually production limited by the rate at which plates can be dried.

The use of isoparaffinic solvents as the non-solvent base of the washout solvent of the invention has other benefits over that of traditional aliphatic or naphthinic distillates in the same boiling ranges. The benefits includes:

(1) Less energy is used when drying the plates. Also, less energy used to distill or reclaim the solvent for reuse. The isoparaffinic solvents normally have lower latent heats of vaporization;

(2) Isoparaffinic solvents exhibit less swelling of rubber or elastomer seals and hosing;

(3) Isoparaffinic solvent exhibit lower odor characteristics than the odor characteristics of traditional aliphatic distillates; and (4) Isoparaffinic solvents, with purity approaching that of U.S.P. White Oil, are less irritating to the skin than traditional aliphatic solvents.

The following examples are given to illustrate the present invention. It should be understood that the invention is not to be limited to the specific conditions or details described in these examples. In all of the following examples, 0.067 inch thick photopolymer plates (polymers as described) were processed using the following MTE solvent blend of terpinyl alkyl ether (50% by weight), fenchyl alkyl ether (30% by weight) and linalyl alkyl ether (20% by weight). The photopolymer developing solvent as tested includes the above-listed MTE blend (12.5% by volume), benzyl alcohol (12.5% by volume), hydrotreated 142 degree F. flash point mineral spirits (74% by volume) and alpha terpineol (1% by volume). In the tests, the flexographic printing plate was first pre-exposed uniformly from the back in a Polimero AO (type HP 400 EXPO) exposure unit for 8 seconds, then exposed imagewise for 6 minutes by a photographic negative placed on the protective layer and developed with 20 liters of washout solvent as described above at 80° F. in a Starflex 860B.LF dual brush rotary flexographic plate washout unit. The washout time used to determine the washout rate was 5 minutes. Washout rate as determined herein is the amount of unexposed photopolymer plate removed during the plate development process measured in inches divided by the time used to develop the plates (5 minutes) giving a rate in inches per minute. In the examples below, the swelling in terms of thickness was determined, in percent, using a dial indicating micrometer. The quality of the sidewall structure of the image elements was assessed visually with the aid of a microscope. The criteria employed to determine quality of the sidewall structure were steepness of the sidewalls, degree of undermining of the sidewalls and degree of rounding of the relief edges.

EXAMPLE 1

Development of Styrene-Isoprene (SIS) Plates Using MTE Based Solvent Blend Photopolymer Plates based on a block copolymer of styrene and isoprene were processed using the terpene ether based solvent blend described above. The washout rate was determined to be 0.0034 inches per minute. The sidewall structure of the image elements was satisfactory, and rounding of the relief edges and undermining of the sidewalls was not observed. The swelling in terms of the thickness was 7.5%. The flexographic printing plate was dried for 100 minutes at 140 degrees F. in a vented dryer until the plate thickness returned to 0.067 inches.

EXAMPLE 2

Development of Butadiene-Acrylonitrile Plates Using MTE Based Solvent Blend Photopolymer Plates based on a block copolymer of butadiene and acrylonitrile were processed using the terpene ether based solvent blend described above. The washout rate was determined to be 0.0040 inches per minute. The sidewall structure of the image elements was satisfactory, and rounding of the relief edges and undermining of the sidewalls was not observed. The swelling in terms of the thickness was 7.5%. The flexographic printing plate was dried for 80 minutes at 140 degrees F. in a vented dryer until the plate thickness returned to 0.067 inches.

EXAMPLE 3

Development of Terpolymer Plates Using MTE Based Solvent Blend Photopolymer

Plates based on a block terpolymer of butadiene, acrylonitrile and acrylic acid were processed using the terpene ether based solvent blend described above. The washout rate was determined to be 0.0038 inches per minute. The sidewall structure of the image elements was satisfactory, and rounding of the relief edges and undermining of the sidewalls was not observed. The swelling in terms of the thickness was 10.4%. The flexographic printing plate was dried for 90 minutes at 140 degrees F. in a vented dryer until the plate thickness returned to 0.067 inches.

EXAMPLE 4

Development of Styrene-Butadiene (SBS) Plates Using MTE Based Solvent Blend Photopolymer Plates based on a block copolymer of styrene and butadiene were processed using the terpene ether based solvent blend described above. The washout rate was determined to be 0.0034 inches per minute. The sidewall structure of the image elements was satisfactory, and rounding of the relief edges and undermining of the sidewalls was not observed. The swelling in terms of the thickness was 7.4%. The flexographic printing plate was dried for 10 minutes at 140 degrees F. in a vented dryer until the plate thickness returned to 0.067 inches.

EXAMPLE 5

Comparison of Isoparaffinic and Hydrotreated Naphthinic Solvents

The drying times of the following flexo plate washout formulations were compared in a commercial, high volume, platemaking facility:

| Formulation 1 | | Formulation 2 | |
|---|---|---|---|
| Component | Weight Percent | Component | Weight Percent |
| Mixed Terpene Esters* | 13.3% | Mixed Terpene Ethers* | 15.4% |
| Hydrotreated hydrocarbons** | 69.0% | Hydrotreated hydrocarbons** | 72.5% |
| Benzyl Alcohol*** | 15.4% | Benzyl Alcohol*** | 12.8% |
| Alpha Terpenol**** | 2.3% | Alpha Terpenol**** | 2.3% |

*The mixed terpene ester is the mixture of terpinyl alkyl esters (50% by weight), fenchyl alkyl esters (30% by weight) and linalyl alkyl esters (20% by weight). The mixed terpene ether is the mixture of terpinyl alkyl ethers (50% by weight), fenchyl alkyl ethers (30% by weight) and linalyl alkyl ethers (20% by weight).
**The hydrotreated hydrocarbon is Shell 142 HT and the isoparaffinic hydrocarbon is Exxon Isopar L.
***The benzyl alcohol is Bayer photograde.
****The alpha terpinol acts as a co-solvent to keep the components from separating.

EXAMPLE 6

Numerous plates of manufacturers brand and style were run in a second high volume plate making facility to compare the drying time of Formula 2 using an isoparaffinic non-solvent versus Formula 1 using an aliphatic distillate as the non-solvent in the washout solution of the invention.

In the second high volume platemaking test facility, the criterion for a dry plate was when the print height of the plate had returned to within 0.0005 inches of its original gauge or thickness. In many cases it was found that the original non-processed plate material had variances at least this large. It became apparent that all plates should be inspected prior to developing for initial gauge of the material before processing to be able to use this tight drying gauge tolerance at this facility.

| Plate Mfg. | Style | Gauge | Formulation 1 Drying Time | Formulation 2 Drying Time |
|---|---|---|---|---|
| Polyfibron | EPIC | .067 | 180 minutes | 80 minutes |
| Polyfibron | EPIC | .067 | 180 minutes | 90 minutes |
| Polyfibron | EPIC | .067 | 180 minutes | 70 minutes |
| DuPont | PLS | .067 | 240 minutes | 90 minutes |
| DuPont | PLS | .067 | 240 minutes | 120 minutes |
| DuPont | PLS | .067 | 240 minutes | 100 minutes |
| DuPont | HOS | .107 | 270 minutes | 170 minutes |
| DuPont | HOS | .107 | 270 minutes | 170 minutes |
| DuPont | TDR | .250 | 300 minutes | 155 minutes |
| DuPont | TDR | .250 | 300 minutes | 140 minutes |
| DuPont | TDR | .250 | 300 minutes | 165 minutes |

Formulation 2 with isopariffinic solvent as the non-solvent reduced drying times on these commercially run printing plates by 30–55%. The washout or developing times used to process the above plates were identical regardless of formulation. Drying times of formulation 1 were established as the average drying time over a six month history.

The invention has been disclosed broadly and illustrated in reference to representative embodiments described above. Those skilled in the art will recognize that various modifications can be made to the present invention without departing from the spirit and scope thereof.

What is claimed is:

1. A method for the development of photopolymerizable flexographic relief printing plates comprising:

selecting a developing solvent, said developing solvent comprising at least one terpene ether; and washing an exposed flexographic relief printing plate with said developing solvent.

2. The method of claim 1, wherein the photopolymerizable flexographic relief printing plates is selected from the group consisting of block co-polymers of styrene and butadiene, block co-polymers of styrene and isoprene, co-polymers of butadiene and acrylonitrile, terpolymers of butadiene, acrylonitrile, and acrylic acid.

3. The method of claim 1, wherein the developing solvent further comprising a co-solvent.

4. The method of claim 3, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, and 2-(2-butoxyethoxy) ethanol, substituted cyclopentanol, substituted cyclohexanol, substituted cycloheptanol, cyclopentyl substituted alcohol, cyclohexyl substituted alcohol, and cycloheptyl substituted alcohol.

5. The method of claim 4, wherein the substituted cyclohexanol is 4-ethycyclohexanol.

6. The method of claim 4, wherein the substituted cyclopentanol is 2,3 dimethylcyclopentanol.

7. The method of claim 4, wherein the cyclohexyl substituted alcohol is cyclohexylpropanol.

8. The method of claim 4, wherein the cyclopentyl substituted alcohol is 4-cyclopentylpentanol.

9. The method of claim 1, wherein the developing solvent further comprising a non-solvent.

10. The method of claim 9, wherein the non-solvent is selected from the group consisting of aliphatic petroleum distillates, naphthas, paraffinic solvents, hydro-treated petroleum distillates, mineral oil, mineral spirits, ligroin, decane, octane, and hexane.

11. The method of claim 1, wherein the developing solvent further comprising a co-solvent and a non-solvent.

12. The method of claim 11, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, and 2-(2-butoxyethoxy) ethanol, substituted cyclopentanol, substituted cyclohexanol, substituted cycloheptanol, cyclopentyl substituted alcohol, cyclohexyl substituted alcohol, and cycloheptyl substituted alcohol.

13. The method of claim 11, wherein the non-solvent is selected from the group consisting of aliphatic petroleum distillates, naphthas, paraffinic solvents, hydro-treated petroleum distillates, mineral oil, mineral spirits, ligroin, decane, octane, and hexane.

14. The method of claim 11, wherein the terpene ether is present in an amount of about 50–70% by volume, the co-solvent is present in an amount of about 20–50% by volume, and the non-solvent is present in an amount of about 10–30% by volume.

15. The method of claim 1, further comprising drying the flexographic relief printing plate to remove the developing solvent.

* * * * *